INVENTOR
DONALD F. BRENNAN
BY [signature]
HIS ATTORNEY

INVENTOR
DONALD F. BRENNAN
BY J. F. McDevitt
HIS ATTORNEY 3,560,829

PULSE WIDTH MODULATED BRIDGE POWER AMPLIFIER WITH MEMORY AND LOCKOUT LOGIC

Donald F. Brennan, Dalton, Mass., assignor to General Electric Company, a corporation of New York Filed Jan. 28, 1969, Ser. No. 794,738
Int. Cl. G05b *11/28*
U.S. Cl. 318—599 15 Claims

ABSTRACT OF THE DISCLOSURE

A pulse width modulated bridge power amplifier with memory and lockout logic comprised by at least first, second, third and fourth gate controlled power semiconductor devices such as transistors connected in the form of a Wheatstone bridge with one set of diagonally opposed terminals of the power bridge being connected across a pair of power supply terminals and an electric load being connected across the remaining set of diagonally opposed terminals. The bridge is comprised such that the first and second power semiconductor devices supply load current through the load in one direction and the third and fourth power semiconductor devices supply load current through the load in the opposite direction. The memory logic and lockout gating circuit is coupled to the control gates of the power gate controlled semiconductor devices for selectively gating on and locking out operation of desired ones of the devices to thereby provide proportionally controlled amounts of excitation current of a desired polarity through the load. The memory and lockout logic gating circuit comprises a polarity determining input circuit for providing pulse width modulated, reversible polarity, input control signals indicative of the polarity and magnitude of the excitation current to be supplied to the load.

BACKGROUND OF INVENTION

Field of invention

Figure 1:
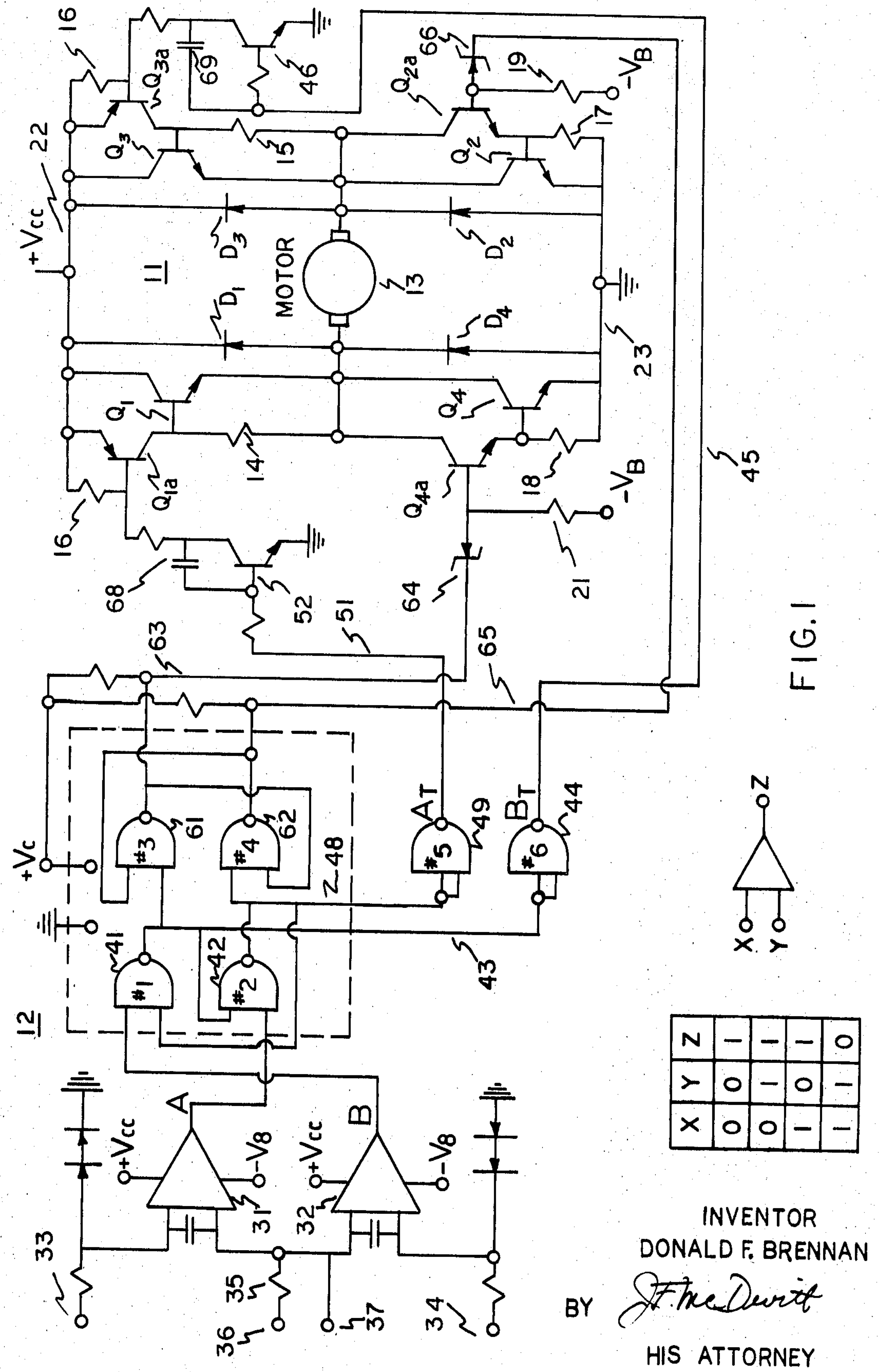

This invention relates to a new and improved, pulse width modulated, bridge, power amplifier with memory and lockout logic.

More specifically, the invention relates to such a bridge power amplifier which includes novel gating-on memory logic circuitry for holding on only one of the previously conducting lower bridge arms (transistors) which was conducting prior to the removal of the drive voltage, and which serves to circulate coasting current through the load during drive voltage off-time. The invention further provides novel lockout logic circuitry which prevents the application of gating-on signals to both sides of the power bridge simultaneously as well as prevents application of simultaneous gating-on signals to both the upper and lower power transistors on the same side of the power bridge.

Statement of prior art

In U.S. patent application Ser. No. 606,806 entitled "Pulse Width Modulation Power Switching Servo Amplifier," John A. Joslyn and David A. Citron, inventors, filed Jan. 3, 1967, and assigned to the General Electric Company, a pulse width modulated bridge power amplifier is disclosed. The pulse width modulated bridge power amplifier (hereinafter referred to as a PWM bridge power amplifier) is highly satisfactory for driving servomotors and the like, and employs diagonally opposed power switching elements (such as power transistors) which are caused to conduct current through the load in a given direction with one set of diagonally-opposed elements causing load current flow in one direction, and the remaining set of diagonally-opposed elements causing load current flow in the reverse direction. By modulating or controlling the conducting intervals (conduction times) of the sets of diagonally-opposed power switching elements, current flow through the load can be proportionally controlled. The PWM bridge power amplifier disclosed in application Ser. No. 606,806 also discloses a gating-on and corner lockout logic circuit for preventing simultaneous application of gating-on signals to both power transistors on the same sides of the power bridge. This known gating-on and corner lockout logic circuitry also perform the dual function of turning-on the power bridge lower corner power transistors in the absence of any call for drive voltage in either the forward or reverse direction. By this arangement, curent flowing in the load could be recirculated through the load during off-periods of the drive voltage so as to in-effect average out the current supplied to the load. This technique is quite advantageous with inductive loads such as electric motors where it is desirable to average the current flowing in the load. However, this known corner lockout logic circuitry did give rise to a "race" condition with regard to the respective turn-off and turn-on times of the lower and upper power transistors on the same side of the power bridge. It will be appreciated that with regard to any such "race" condition, should a lower corner power transistor lose the "race," and fail to turn-off prior to turn-on of the upper corner power transistor on the same side of the power bridge, a dead short-circuit condition would exist which would give rise to undesired current surges that are potentially destructive to the power bridge, reduce reliability, etc. The present invention is designed to overcome this situation.

SUMMARY OF INVENTION

It is therefore a primary object of the present invention to provide a new and improved PWM bridge power amplifier having improved memory and lockout logic gating-on circuitry.

Another object of the invention is to provide such an improved PWM bridge power amplifier for driving servomotors and the like which is free of undesired current surges due to transient short circuiting conditions, etc., during motor current reversing and similar operating conditions.

Still another object of the invention is to provide a PWM bridge power amplifier having the above characteristics which can be fabricated at least in part of conventional, commercially available, monolithic integrated circuit blocks.

In practicing the invention, the PWM bridge power amplifier with memory and lockout logic gating-on circuitry is provided which comprises at least first and second, and third and fourth gate controlled, power semiconductor, controlled conduction devices (transistors) connected in the form of a Wheatstone bridge with one set of the diagonally-opposed terminals of the power bridge being connected across a pair of power supply terminals that in turn are adapted to be connected across a source of electric energy. The electrical load is connected across the remaining set of diagonally-opposed terminals of the power bridge. The power bridge is comprised in such a manner that upon the first and second power semiconductor devices being rendered conductive, load current is supplied through the load in one direction, and upon the third and fourth power semiconductor devices being rendered conductive, load current is supplied through the load in the opposite direction. Memory logic and lockout gating circuit means is coupled to the respective control gates of the power gate control semiconductor devices for selectively gating-on and locking-out operation of desired ones of the power seimconductor devices to variably control the conduction intervals and provide proportionally controlled amounts of excitation current of a desired polarity through the load. The memory logic and lockout gating circuit means comprises polarity determining input circuit means for providing pulse width modulated, reversible polarity, input control signals indicative of the polarity and magnitude of the excitation current to be supplied to the load. First NAND gate logic circuit means are supplied from the polarity determining input circuit means for gating-on a selected one of the set of the first and second or a selected one of the set of third and fourth power semiconductor devices to supply excitation current through the load in a given direction, and for locking-out conduction through the remaining set. Second NAND gate memory logic circuit means is supplied from the first NAND gate logic circuitry for supplying an enabling gating-on potential to the control gate of the remaining power semiconductor device in the selected set of first and second or the selected set of third and fourth power semiconductor devices in accordance with the direction which load current is to be circulated through the load. The second NAND gate memory logic circuit means serves to memorize and maintain the supply of an enabling gating-on potential through the control gate of the last mentioned, remaining one of the selected set of the first and second, or the selected set of the third and fourth power semiconductor devices for maintaining the device conducting to thereby circulate load current through the load intermediate the pulse conduction intervals of both power semiconductor devices in the selected set.

The above described PWM bridge power amplifier also further includes means in each arm of the power bridge containing the first and second and the third and fourth gate controlled power semiconductor devices for circulating load current in two directions in at least two adjacent arms of the power bridge, the said two adjacent arms being connected to opposite terminals of the load and having a common power supply terminal connection. The PWM bridge power amplifier also further includes delay means interposed in the output of the first NAND gate logic circuit means for delaying application of gating-on potentials to a selected one of the set of first and second or a selected one of the set of third and fourth power semiconductor devices for a predetermined period of time sufficient to assure turn-off of the power semiconductor device of the opposite set on the same side of the power bridge.

As a consequence of the above arrangement, the new and improved PWM bridge power amplifier comprises a highly efficient power output stage that is free of transient current surges that are potentially destructive of the circuit and reduce its reliability, and yet effectively utilizes standard, commercially available, integrated circuit component in the fabrication of the circuit. The delay means introduced in the gating-logic circuitry prevents transient short circuit currents that otherwise might be produced when the load current is reversed. The logic circuitry includes a lockout feature which prevents the application of positive gating-on signals to both sides of the bridge simultaneously, while holding on only the lower power semiconductor device (transistor) of the bridge which was on prior to the removal of the drive voltage to the upper portion of the bridge. This serves to provide a coasting short circuit path through the load as is normally done during the off-time through the medium of a feedback diode, but does so without turning on both lower, gated, power seimconductor devices (transistors). This feature then eliminates the "race" condition which otherwise might exist when the upper arm of the power bridge is turned back on during a drive voltage interval.

Figures 2, 2A, 2B, 2C:
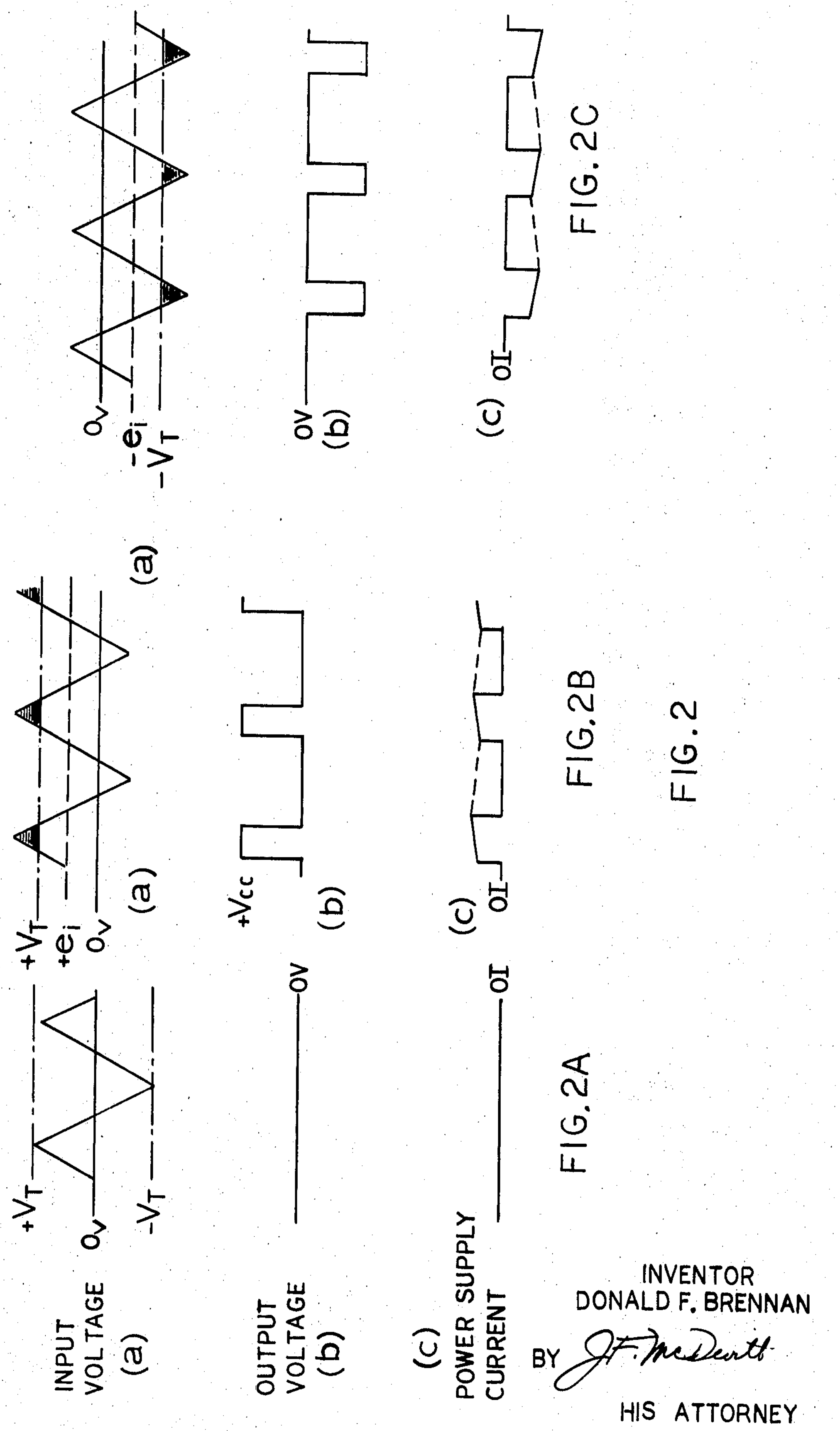

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein:

FIG. 1 is a detailed, schematic circuit diagram of a new and improved pulse width modulation bridge power amplifier with memory and lockout logic constructed in accordance with the invention; and FIG. 2 is a series of wave forms illustrating the manner of operation of the pulse width modulation bridge power amplifier shown in FIG. 1.

DETAILED DESCRIPTION OF PREFERRED EMBODIMENT

The PWM bridge power amplifier shown in FIG. 1 is comprised of two separate power level sections. One of the sections is comprised by a low signal level, gating-on logic circuit modules which convert an error signal received from a servo-input or the like to two different error control pulses of varying width and representative of opposite polarities. These varying width, opposite polarity control pulses are then processed in suitable logic circuit blocks to cause the power level section of the PWM bridge power amplifier to supply current through the load, which may comprise a servomotor, in a direction, and of a magnitude dictated by the nature of the error control pulses supplied from the gating-on, logic circuitry. Thus it will be seen that the second or high power section of the PWM bridge power amplifier (shown generally at 11), is in fact controlled in its operation by the lower signal level, gating-on, logic control circuitry shown generally at 12.

The higher power section 11 of the overall PWM bridge power amplifier may be designed to control a servomotor such as shown at 13, and is comprised by at least a first $Q_1$ and second $Q_2$, and a third $Q_3$ and fourth $Q_4$, gate-controlled, power semiconductor controlled conduction devices such as NPN, planar, passivated power transistors of the General Electric type 2880 manufactured and sold by the Semiconductor Products Department of the General Electric Company located in Syracuse, N.Y. The power transistors $Q_1$ through $Q_4$ may in fact comprise the second or power output transistor of a two transistor power stage whose first stage power transistors $Q_{1a}$ through $Q_{4a}$ in fact drive the base electrodes of the output power transistors $Q_1$ through $Q_4$, respectively. For this purpose, the base electrodes of the two output power transistors $Q_1$ and $Q_3$ are connetced across the collector load resistor 14 and 15 connected in the emitter-collector circuits of the first stage transistors $Q_{1a}$ and $Q_{3a}$, respectively. The first stage power transistors $Q_{1a}$ and $Q_{3a}$ have resistors 16 connected across the base-emitters thereof for improving the input impedance characteristics of the overall two transistor power stages without reducing their power handling capabilities. Similarly, the base electrodes of the output power transistors $Q_2$ and $Q_4$ are connected across emitter resistors 17 and 18 connected in the emitter-collector circuits of the first power transistors $Q_{2a}$ and $Q_{4a}$, respectively, and separate bias potentials are applied through relatively large value resistors 19 and 21 to the base electrodes of the first power transistors $Q_{2a}$ and $Q_{4a}$ which similarly serve to improve the sensitivity of the power stage without impairing its power handling capability. For convenience, in the following discussion when referring to a gate controlled power semiconductor, controlled conduction device or power transistor, only a single device such as $Q_1$ will be referenced; however, it should be understood that while only a single power transistor such as $Q_1$ could be employed, the term also is intended to include any suitable two transistor power stage such as that disclosed, a single power transistor, or if desired could be comprised by a gate controlled unidirectional conducting device such as a gate turn-off, silicon controlled rectifier, or its bilateral equivalent the triac by certain circuit modifications thought to be obvious in the light of the present teachings. Accordingly, it will be understood the circuit is in no way limited to fabrication with only the exact components illustrated, but by certain changes which would be obvious to one skilled in the electronics art, could be readily adapted to incorporate other satisfactory types of power switching devices and the like.

From a consideration of FIG. 1, it will be seen that the first and second power transistors $Q_1$ and $Q_2$, and the third and fourth power transistors $Q_3$ and $Q_4$ form a type of Wheatstone power bridge with one set of diagonally opposed terminals of the power bridge comprised by the juncture of the transistors $Q_1$ and $Q_3$ and the juncture of the transistors $Q_2$ and $Q_4$ being connected across a pair of power supply terminals 22 and 23 which in turn are adapted to be connected across a source of electric energy such as a 28-volt, direct current battery power supply, or some similar DC source. If desired, the circuit also could be employed with an alternating current source of electric energy and used to chop out desired portions of a half cycle of the alternatiing current supply. It will be further appreciated from FIG. 1, that the motor 13 is connected across the remaining diagonally-opposed terminals of the power bridge in a manner such that upon the first and second power transistors $Q_1$ and $Q_2$ being rendered conductive, load current will be supplied through the motor 13 in the first direction, and upon the third and fourth power transistors $Q_3$ and $Q_4$ being rendered conductive, load current is supplied through the load in the opposite direction. The periods of conduction of these two sets of diagonally opposed power transistors $Q_1$ and $Q_2$ or $Q_3$ and $Q_4$ are then pulse width modulated (i.e. pulse duration controlled) to determine the overall or average value of the current supplied to the motor 13, thereby controlling its torque, speed, etc., and the direction of rotation of the motor is determined by which one of the two diagonally opposite sets of power transistors $Q_1$, $Q_2$ or $Q_3$, $Q_4$ is supplying the excitation current.

Because the current supplied to the motor 13 in the above briefly described manner, is pulsed in nature, it is necessary to provide some means for circulating reactive energy trapped in the windings of the motor 13 during intervals of nonconduction of the power switching transistors $Q_1$, $Q_2$ or $Q_3$, $Q_4$. For this purpose, feedback diodes $D_1$, $D_2$ and $D_3$, $D_4$, are provided and are connected in reverse polarity, parallel circuit relationship with respective ones of the power transistors $Q_1$, $Q_2$ and $Q_3$, $Q_4$. It should also be noted that if the bridge polarity is reversed before the current through the motor load 13 reaches zero, the inductive current nevertheless must continue to flow in accordance with Lenz law. To provide for this contingency, the diodes $D_1$–$D_4$ allow for discharge of the reactive energy back to the power supply, and accordingly the power supply must be capable of absorbing the motor inductive energy.

The above referenced U.S. patent application Ser. No. 606,806 describes and claims a PWM bridge power amplifier which is highly satisfactory for driving servomotors and the like, and which includes corner lockout logic circuitry for preventing simultaneous application of gating-on signals to both power transistors on the same side of the power bridge. This known gating-on and corner lockout logic circuitry also performed the dual-function of turning-on the power bridge, lower corner power transistors such as $Q_4$ and $Q_2$ in the absence of any call for drive voltage either in the forward or reverse direction. By this arrangement, current flowing in the motor 13 could be recirculated or short-circuited during off-periods of the drive voltage so as to in effect average out the current supplied to the load, and this interval of operation is often referred to as coasting. The technique is quite advantageous with motor loads where it is desirable to average the current flowing in the motor and hence drive the motor at steady state speed, torque, etc. However, this known corner lockout logic circuitry did give rise to a "race" condition with regard to the respective turn-off time of at lower transistor such as $Q_4$ and the turn-on time of an upper power transistor such as $Q_1$ on the same side of the power bridge. It will be appreciated that with regard to any such "race" condition, should the lower corner power transistors such as $Q_4$ lose the "race," and fail to turn off prior to turn-on of the upper corner power transistor $Q_1$ on the same side of the power bridge, a dead short-circuit condition would exist which would give rise to undesired current surges that are potentially destructive to the power bridge, particularly the power transistor, reduce its reliability, etc. The new and improved memory and lockout gating circuitry shown generally at 12, is designed to overcome this undesirable characteristic.

The memory and lockout logic gating circuit means shown generally at 12 has its output coupled to the control gates of the respective power transistors $Q_1$–$Q_4$ as will be described more fully hereinafter for selectively gating-on and locking-out operation of desired ones of the power semiconductor transistors $Q_1$–$Q_4$ to thereby variably control the conduction intervals of the respective power transistors, and provide proportionally controlled amounts of excitation current of a desired polarity through the motor 13. The memory and lockout logic gating circuit means is comprised by polarity determining input circuit comprised by a positive threshold detector 31 and a negative threshold detector 32. The positive and negative threshold detectors 31 and 32 are conventional, commercially available, monolithic integrated circuit structures such as the FuA710 circuit manufactured by the Fairchild Camera Company, Texas Instrument, ITT, etc. or some other similar multi-purpose, monolithic integrated circuit differential amplifier chip connected to operate in its comparator mode. For this purpose, the positive threshold detector 31 has one of its input terminals connected through a suitable limiting resistor and diode clamp arrangement to a source 33 that provides the positive threshold voltage level to be used by the detector in the operation of the circuit. Similarly, the negative threshold detector 32 has one of its input terminals connected to a source of negative potential 34 through a suitable limiting resistor and diode clamping string for providing a negative threshold voltage for use during the operation of the circuit. The remaining input terminals of both the positive and negative threshold detectors 31 and 32 are connected in common through a current limiting resistor 35 to a source of triangular wave shape reference potential applied to the terminal 36 and then supplied to both of the positive and negative threshold detectors 31 and 32 in common. In addition, the same two common terminals of the positive and negative threshold detectors 31 and 32 are connected to a terminal 37 that in twin is connected to a common source of reversible polarity, variable magnitude direct current error signals $e_i$. By this arrangement, the threshold detectors 31 and 32 serve to sum the input DC error signal with the input triangular wave shape reference potential, and to derive an output error signal whose value indicates whether or not the summed input error signal and triangular wave shape reference potential is above or below a threshold value, and the duration of this output signal provides an indication of the magnitude of the error.

FIG. 2 of the drawings is a series of voltage and current versus time wave shapes illustrating the manner in which the positive and negative threshold detectors operate to develop output error signals whose magnitude and polarity are indicative of the excitation current to be supplied to the motor 13 by the PWM bridge power amplifier. Assuming that there is no error voltage being supplied to the threshold detectors 31 and 32 from error signal input terminal 37, then the detectors are adjusted so that the triangular wave shape reference voltage peaks at a value just below the threshold values indicated as plus $V_T$ and minus $V_T$ in the manner illustrated in curve *a* of FIG. 2A. If it is assumed then that the error signals supplied to the input terminal 37 assumes some value such as plus $e_1$ as shown in curve *a* of FIG. 2B, then the combined DC error signal and triangular wave shape reference voltage will be lifted in the manner shown in FIG. 2B(*a*) so that some portion of the positive peak of the triangular wave shape reference potential exceeds the positive threshold voltage value plus $V_T$. As a consequence of this action, the positive threshold detector 31 will produce output voltage pulses such as those shown in curve *b* of FIG. 2B which have a positive or plus polarity and have a time duration determined by the level at which the triangular wave shape reference potential is intercepted by the threshold voltage value $V_T$. During the intervals that the positive threshold detector 31 is producing these positive polarity pulse width modulation output error signal pulses, the output of the detector 31 will be raised from a zero potential level to a positive potential level which shall be defined as a logic "1" potential level of fixed voltage value but for a variable time period as determined by the summation value of the input error signal and the triangular wave shape reference voltage in the manner shown in FIG. 2B(*a*). In a similar manner, the negative threshold detector 32 functions as illustrated in FIG. 2C(*a*) to derive output error signals which go from a zero voltage level to some positive logic "1" voltage level for a time duration determined by the intercept of the threshold voltage $-V_T$ with the negative peak amplitudes of the triangular wave shape reference potential (and hence will have a wave shape similar to the positive error pulses as shown in FIG. 2B(*b*)). These pulse modulated error signals are of course produced at the repetition rate of the triangular wave shape reference potential. It will be appreciated, however, that the positive and negative threshold detector circuits 31 and 32 function as polarity determining input circuits for providing pulse width modulated, reversible polarity input control signals indicative of the polarity and magnitude of the excitation current to be supplied to the load by the PWN bridge power amplifier.

The outputs of the respective positive and negative threshold detectors 31 and 32 are supplied to the input of a first NAND gate logic circuit means comprised by a pair of conventional NAND gates 41 and 42. The NAND gates 41 and 42 as well as all other of the NAND gates hereinafter referred to are conventional, commercially available nine hundred series 900 DTL logic chips such as those manufactured and sold by the Fairchild Camera Company, Texas Instrument, Motorola, International Telephone and Telegraph, and a number of other integrated circuit manufacturers. The NAND gate 41 has one of its inputs connected directly to the output of the negative threshold detector 32, and has a remaining input connected directly to the output of the other NAND gate 42 of the first NAND gate logic circuitry. Similarly, the NAND gate 42 has one of its input terminals connected directly to the output of the positive threshold detector 31, and has its remaining input terminal connected directly to the output of the NAND gate 41. In addition, NAND gate 41 has its output connected through the conductor 43 and an inverter 44 which is similar in construction to the NAND gate 41 but is merely connected to function as an inverter for inverting a logic "0" level input signal to a logic "1" output signal, or vice versa. The output of inverter 44 is supplied over a conductor 45 to the base electrode of a driver transistor 46 that in turn is connected to drive or turn-on the first stage power transistor $Q_{3a}$ in the upper right corner of the power bridge. In a similar manner, the output of the NAND gate 42 is supplied over a conductor 48 to an inverter 49 whose output in turn is connected over a conductor 51 to the base electrode of a second driver amplifier 52 that turns on or drives the first stage power transistor $Q_{1a}$ of the upper left corner of the power bridge.

The truth table for the NAND gates 41 and 42, and for that matter for all of the NAND gates to be described herein, is shown in the lower left-hand corner of FIG. 1 along with a sketch of one of the NAND gates labelling the two input terminals of the NAND gate X and Y and the output terminals of the NAND gate Z. From a consideration of the truth table, it will be seen that if both input terminals X and Y have zero volt input signals which shall be defined as the "0" state, then the output terminal Z will produce a positive output voltage defined as the "1" state. Other combinations of input signals to the input terminals X and Y are also shown in the truth table. It is only when both input terminals A and B have a positive "1" state input signal that a "0" state output signal is obtained. From a consideration of this truth table, and the interconnection of the two NAND gates 41 and 42 comprising the first NAND gate logic circuit means, it will be seen that only one or the other of the two NAND gates is capable of providing a zero output signal, and that upon this occasion, the other NAND gate necessarily must provide a one output signal due to the interconnection back to its input terminal from the output of the opposite NAND gate. It will also be appreciated that upon either one of the NAND gates 41 and 42 producing a "0" state output signal, due to the inversion provided by the inverters 44 and 49, either the upper left or upper right power transistor $Q_1$ or $Q_3$ will be turned on and rendered conductive, and the other of the power transistors $Q_1$ or $Q_3$ will be maintained locked out. As a consequence, conduction of only one of the power semiconductor devices either $Q_1$ or $Q_3$ in the upper half of the power bridge is allowed, and concurrent conduction of both upper semiconductor control devices $Q_1$ and $Q_3$ on the upper half of the power bridge is positively prevented due to the lockout provided by the first NAND gate logic modules 41 and 42. In this manner, it is assured that conduction through the load can take place in only one direction at a given point in time.

The output of each of the first NAND gates 41 and 42 are also connected to second NAND gate memory logic circuit means comprised by a second set of interconnected NAND gates 61 and 62. The NAND gate 61 has one of its input terminals connected directly to the output from the NAND gate 41, and has its remaining input terminal connected directly to the output of the NAND gate 62. Similarly, the NAND gate 62 has one of its input terminals connected directly to the output of the NAND gate 42 and has its remaining input terminal connected directly to the output from the NAND gate 61. As a consequence of this interconnection arrangement, the NAND gates 61 and 62 form a bistable memory element which remains operative in the last state to which it has been triggered by an input signal supplied thereto from either of the NAND gates 41 or 42, as will be explained more fully hereinafter. The NAND gate 61 has its output terminal connected over a conductor 63 and through a Zener diode 64 to the base electrode of the second power transistor $Q_{4a}$ that drives the lower left corner of the power bridge, and the NAND gate 62 has its output terminal connected over the conductor 65 through a Zener diode 66 to the base electrode of the power transistor $Q_{2a}$ that drives the lower right corner of the power bridge. It will be appreciated, therefore, that by reason of the memory capability of the bistable flipflop formed by the interconnected NAND gates 61 and 62, these NAND gates will serve to maintain an enabling gating-on potential to the control gate or base of either the second or fourth power transistor $Q_2$ or $Q_4$ for maintaining that power device conducting for so long as there is a need to circulate load current through the motor 13. The need for this capability will become apparent more fully hereinafter following a detailed discussion of the various operating modes of the PWM bridge power amplifier. It should be noted, however, that because of the above mentioned memory capability of the interconnected NAND gates 61 and 62, that the power semiconductor device (either $Q_2$ or $Q_4$) which previously had been conducting to supply current through the load during a drive voltage-on interval, will remain conducting until a reversal of current through the load is called for, and the bistable memory device comprised by the interconnected NAND gates 61 and 62 is caused to change state.

In order to prevent any possible "race" condition from arising during current reversal through the motor, delay means are interposed in the outputs of the first NAND gate logic circuit means comprised by the NAND gates 41 and 42 for delaying application of gating-on potential to the first and third power semiconductors $Q_1$, $Q_{1a}$ and $Q_3$, $Q_{3a}$ for a predetermined period of time sufficient to assure turn-off of either the fourth or second power semiconductor devices $Q_4$, $Q_{4a}$ or $Q_2$, $Q_{2a}$ on the same side of the power bridge. This delay means comprises a capacitor 68 connected across the base-collector of the driver transistor 52 and a capacitor 69 connected across the base-collector of the driver transistor 46. The delay capacitors 68 and 69 serve to introduce sufficient delay in the application of turning on potentials to the upper corner of transistor during current reversal as will be explained more fully hereinafter in connection with the detailed explanation of the overall operation of the PWM bridge power amplifier.

The basic implementation of the PWM bridge power amplifier described above is to mix an input DC error signal with a triangular reference voltage, and apply the resultant output to the inputs of a pair of level sensing detectors. The level sensing detectors then operate through the gating-on memory and lockout logic circuitry to derive a train of voltage pulses whose duty cycle and polarity are proportional to the amplitude and polarity of the input signal. The inclusion of the reverse polarity connected, feedback diode across each of the gate controlled power semiconductor transistors $Q_1$, $Q_{1a}$, etc. provides a dynamic, short circuit coasting path across the motor during off-time of the train of drive voltage pulses to allow for inductive current decay. This coasting short circuit path causes average voltage across the motor to be directly proportional to the on-time of the power transistors and provides excellent transfer function linearity for the overall PWM bridge power amplifier. The amplitude of the triangular wave shape reference potential is adjusted to be approximately equal to the level sensing detector threshold level so that there is no significant dead band or overlap in the null condition of the bridge power amplifier. These features provide highly efficient power control through on-off operation of the power transistors, and allows the use of a single battery primary power source with no large inverter required. The amplifier requires low stand-by power since there is no DC or AC on the load for null conditions. The DC transfer function can be designed to be better than one percent linearity with negligible dead band as mentioned above. The switching frequency can be as high as desired, limited only by the transistor switching speed since the load inductance does not limit the switching frequency. This provides for negligible sampling phase shift in high bandwidth servo systems, and also assures that there is minimum AC heating in the motor because of the high switching frequency. Due to all of the characteristics of good linearity, negligible dead band, and negligible sampling phase shift, the PWM bridge power amplifier can be considered as a linear DC amplifier for control systems analysis purposes, and permits a conventional use of Bode diagram or root locus analysis techniques.

There are four possible operating conditions for the PWM bridge power amplifier, and the occurrence of each operating condition is determined by the combined value of the input triangular wave shape reference voltage plus the signal error voltage $e_i$ referenced to the threshold voltage levels plus or minus $V_T$. As stated earlier, with the combined value of the error signal voltage $e_i$ and the triangular wave shape reference potential, below the positive threshold voltage ($+V_T$) and above the negative threshold voltage potential ($-V_T$), the output of both of the threshold detectors 31 and 32 will be at "0" logic level. Upon the combined error signal voltage and triangular wave shape reference potential exceeding the positive threshold voltage value ($+V_T$) the output of the threshold detector 31 goes to a logic "1" level and remains there for the period of time that the threshold voltage value ($+V_T$) is exceeded. Similarly, upon the combined value of the error signal $e_i$ and the triangular wave shape reference potential dropping below the negative threshold voltage value ($-V_T$), the output of the negative threshold detector 32 goes to a logic "1" level and stays there for the period of time that the combined value is below the negative threshold voltage level.

Keeping the above stated possible control situations in mind, the operation of the PWM bridge power amplifier may then be traced through the four following possible operating conditions. Upon the input signal $e_i$ plus the triangular voltage becoming more negative than ($-V_T$), power transistors $Q_3$ and $Q_4$ will turn on, and current built up through the motor at a rate determined by the inductive time constant of the motor circuit. Thereafter, the combined value of the input error signal plus triangular wave shape voltage will drop below the ($-V_T$) value so that power transistor $Q_3$ turns off. However, due to the memory capability of the second set of interconnected NAND circuits 61 and 62, the power transistor $Q_4$ will be maintained turned-on. During this interval (in between each application of positive drive voltage, i.e. both power semiconductors $Q_3$ and $Q_4$ conducting), $Q_4$ will be maintained on and motor current will discharge through the dynamic short circuit comprising $Q_4$ and the feedback diode $D_2$. Repeated cycles of the first operating condition wherein both $Q_3$ and $Q_4$ are turned-on, followed by the second operating condition wherein coasting occurs through $Q_4$ and $D_2$, cause the average value of the current through the motor to reach a steady state value for a steady value input error signal $e_i$, corresponding to a particular motor duty cycle. The AC component of the current through the motor will be small particularly if the inductance to resistance ratio of the motor is large compared to the period of the triangular wave shape reference voltage frequency. While thus operated, the motor 13 is considered to be driven in the reverse direction.

When the combined value of the input error signal $e_i$ and the triangular wave shape reference potential exceeds the threshold value ($+V_T$), the power transistors $Q_1$ and $Q_2$ will be turned-on giving rise to a third operating condition wherein there is a forward polarity drive voltage applied across the motor 13. Upon the combined value of the input error signal $e_i$ and the triangular wave shape reference potential becoming less than ($+V_T$), power transistor $Q_2$ is held on, and transistor $Q_1$ turns off. Reactive current through the motor then is circulated through the short circuit path comprised by the power transistor $Q_2$ and the feedback diode $D_4$. This gives rise to the fourth operating condition of the PWM bridge power amplifier circuit. It should be noted that if the power bridge polarity is reversed prior to the time that the current through the motor reaches a zero value, the inductive current must continue to flow. Diodes $D_1$ or $D_3$ in conjunction with diodes $D_2$ and $D_4$ allow for the feedback or pump back of this reactive energy back into the power supply, and hence the power supply must be capable of absorbing the motor reactive energy.

While the gating-on memory and lockout logic circuit shown generally at 12 in FIG. 1 provides for operation of the power circuit in each of the four above-described operating modes, their operation has not yet been described in detail. Tracing through the above four listed operating conditions for the PWM bridge power amplifier, it should be remembered that because of the memory capability of the second set of interconnected NAND gates 61 and 62, either one or the other of the two lower power transistors $Q_4$ or $Q_2$ will be maintained in a conducting condition as previously described. For convenience in the following description, it will be assumed that the history of the operation of the power bridge was such that the power transistor $Q_4$ is the one that is conducting, in which event the set of interconnected NAND gates 61 and 62 will have been operated so that a logic "1" output signal appears at the output of NAND gate 61 and a logic "0" output signal appears at the output of NAND gate 62.

With the above-stated assumptions in mind, next assume that the output of both threshold detectors 31 and 32 at the particular instant under consideration, is zero volts, which is defined as the "0" state, and that the output of detectors 31 and 32 shall be labelled A and B, respectively. For this operating condition, both of the first interconnected NAND gates 41 and 42 (labelled gates #1 and #2) will have positive polarity output voltages defined as the "1" state. As assumed above, the outputs of the second set of interconnected NAND gates 61 and 62 (labelled gates #3 and #4) will be a function of their previous state due to their interconnection to operate as a flip-flop memory element, and hence there will be a level "1" output at NAND gate 61 (gate #3) and a level "0" output at NAND gate 62 (gate#4). The gates 44 and 49 (labelled gates #5 and #6) operate as inverters, therefore they will have "0" level output under the stated assumption so that no turn-on signal is applied to either of the upper power transistors in the bridge's top half, and only one lower corner transistor (namely $Q_4$) will be conducting and circulating current through the motor load in conjunction with diode $D_2$. The various output states for the several NAND gates and threshold detectors as well as the conducting state of the power transistors $Q_1$–$Q_4$, are listed in Table 1 set forth below for this assumed operating condition.

TABLE #1

| | |
|---|---|
| A | 0 |
| B | 0 |
| #**1** | 1 |
| #**2** | 1 |
| $Q_4$, #**3** | 1 |
| $Q_2$, #**4** | 0 |
| $Q_1$, #**5** | 0 |
| $Q_3$, #**6** | 0 |

Next assume that the combined value of the input error signal $e_i$ and the triangular wave shape reference potential exceeds the negative threshold value $V_T$ in the manner shown in FIG. 2C(a). Upon this occurrence, for limited, reverse drive voltage intervals, the output B of the threshold detector 32 goes to a logic "1" level, so that during these reverse drive intervals, the output states of the logic circuitry switches to that shown in Table 2 set forth below.

TABLE #2

| | |
|---|---|
| A | 0 |
| B | 1 |
| #**1** | 0 |
| #**2** | 1 |
| $Q_4$, #**3** | 1 |
| $Q_2$, #**4** | 0 |
| $Q_1$, #**5** | 0 |
| $Q_3$, #**6** | 1 |

From a consideration of Table 2 it will be seen that during the interval while the negative threshold $-V_T$ is exceeded, load current flows through the motor 13 from power transistor $Q_3$ through the motor, and thence through power transistor $Q_4$. Upon the duty cycle returning to the "off" condition during which intervals the negative threshold value $-V_T$ is no longer exceeded, the logic circuit reverts to the states tabulated in Table 1; however, current will have built up in the inductive motor load 13. To allow for the continuing conduction of this current, the lower corner power transistor $Q_4$ is maintained on, and the diode $D_2$ across power transistor $Q_2$ picks up the current previously supplied through upper right corner power transistor $Q_3$ during the drive voltage interval so as to circulate coasting current through the motor load in the manner depicted by the dotted lines in FIG. 2C(*c*). This provides the dynamic, coasting short circuit path through the motor load during the drive voltage off-time intervals. It will also be apparent that as the input is switched between the zero and $-V_T$ (minus threshold voltage level), the second set of interconnected NAND gates 61 and 62 serve as a memory to maintain "on" that one of the lower corner power transistors $Q_4$ or $Q_2$ which was previously conducting so as to enable the coasting, short circuiting circulating condition.

Next assume that the input DC error signal passes from the vicinity of the negative threshold $-V_T$ without going through the threshold and then to and past the positive threshold $+V_T$. Upon this occurrence, the states of the various NAND gates and power transistors in the PWM power bridge will assume the following values.

TABLE #3

| | |
|---|---|
| A | 1 |
| B | 0 |
| #**1** | 1 |
| #**2** | 0 |
| $Q_4$, #**3** | 0 |
| $Q_2$, #**4** | 1 |
| $Q_1$, #**5** | 1 |
| $Q_3$, #**6** | 0 |

After the switching transient dies out, with the PWM bridge power amplifier in the condition indicated in Table 3, current will have reversed through the motor load 13. The lockout feature of the interconnected first NAND gates 41 and 42 is believed apparent if the condition is assumed where the outputs of both threshold detectors 31 and 32 are considered to be at the logic "1" level. Under any such improbable condition, either the NAND gate 41 or the NAND gate 42 will switch to its logic "0" output first due to the differences in the gates threshold sensitivity, or previous input condition, etc. and once this has happened, the feedback between the interconnected first to-turn-on NAND gate would lock the other output in the logic "1" state. This then assures operation under the conditions stated, and prevents any possible damage due to turn-on of both power transistors on the upper side of the bridge.

The transient condition that occurs in the circuit during its various operating modes are best reviewed by considering the situation that occurs when the external circuit conditions demand that the motor current be reversed. For the purposes of this discussion, assume that the current flows through the motor initially from corner transistor $Q_3$, the motor and lower corner transistor $Q_4$. The states of the various NAND gates and power transistors under this assumed operating condition are then set forth in Table #2. The first step required to reverse the motor current flow is for the input voltage to pass into the dead band or zero output region. Upon this occurrence, the upper right hand transistor $Q_3$ will turn off, but the bridge's lower left corner transistor $Q_4$ will be maintained-on by the bistable memory flip-flop comprised by the interconnected NAND gates 61 and 62. By design, the turn-off time of the upper power transistors $Q_1$ and $Q_3$ is much shorter than the normal time required for the servo to reverse the command polarity, even with the delay provided by the capacitors 68 and 69. Accordingly, with the upper power transistor $Q_3$ turned off, the circuit will assume the states listed in Table #1 for the coasting condition. Upon the input error signal and combined triangular wave shape reference voltage exceeding the positive threshold, the output of the detector 31 goes to the "1" state, and the circuit begins to establish the conditions listed in Table #3. The delay provided in the turn-on of the upper power transistor $Q_1$ by the presence of the delay capacitor 68 will be enough to assure that the lower left corner transistor $Q_4$ turns off, prior to turn-on of $Q_1$. This assures that there will be no transient bridge short circuits which otherwise might be destructive of the power bridge, or impair its reliability.

Another transient condition to be considered and provided for is that which occurs upon initial turn-on of the power supply. To provide for this transient, the Zener diodes 64 and 66 are inserted in the base drive circuit of the lower power transistors $Q_2$ and $Q_4$. These Zener diodes provide a turn-on threshold so that the second set of interconnected NAND gates 61 and 62 will establish their logic levels before there is enough drive available to turn on both lower drive transistors $Q_2$ and $Q_4$. This feature also provides protection in the event of a power supply loss.

The new and improved PWM bridge power amplifier is designed primarily for application to inertial guidance gimbal servos requiring approximately 50–200 watts output power. However, simple re-scaling of the output stage can make the amplifier adaptable to any desired power level, and conceivably could be extended to control 10 kw. direct drive torque motors and the like. While PWM bridge power amplifier has been described as being fabricated from power transistors, it is believed obvious that other similar switching power semiconductor devices such as GTO's, SCR's, etc. could be employed in this circuit by appropriate circuit modifications believed to be obvious to one skilled in the art in the light of the above teachings.

Having described one embodiment of a new and improved pulse width modulated bridge power amplifier with memory and lockout logic constructed in accordance with the invention, it is believed obvious that other modifications and variations of the present invention are possible in the light of the above teachings. It is therefore to be understood that changes may be made in the particular embodiment of the invention described which are within the full intended scope of the invention as defined by the appended claims.

What I claim is new and desired as secured by Letters Patent in the United States is:

1. A pulse width modulated bridge power amplifier with memory and lockout logic comprising at least first and second, and third and fourth gate controlled power semiconductor controlled conduction devices connected in the form of a Wheatstone bridge with one set of diagonally-opposed terminals of the power bridges being connected across a pair of power supply terminals that in turn are adapted to be connected across a source of electric energy, means for connecting an electrical load across the remaining set of diagonally-opposed terminals of the power bridge, the bridge being comprised in a manner such that upon said first and second power semiconductor devices being rendered conductive, load current is supplied through said load in one direction, and upon the third and fourth power semiconductor devices being rendered conductive, load current is supplied through the load in the opposite direction, and memory logic and lockout gating circuit means coupled to the respective control gates of the power gate controlled semiconductor devices for selectively gating-on and locking-out operation of desired ones of the power semiconductor devices to thereby variably control the conduction intervals and provide proportionally controlled amounts of excitation current of a desired polarity through the load, said memory logic and lockout gating circuit means comprising polarity determining input circuit means for providing pulse width modulated reversible polarity input control signals indicative of the polarity and magnitude of the excitation current to be supplied to the load, first NAND gate logic circuit means supplied from said polarity determining input circuit means for gating-on a selected one of the set of the first and second or a selected one of the set of third and fourth power semiconductor devices to supply excitation current through the load in a given direction and for locking-out conduction through the remaining set, and second NAND gate memory logic circuit means supplied from said first NAND gate logic circuit means for supplying an enabling gating-on potential to the control gate of the remaining power semiconductor device in the selected set of first and second or the selected set of third and fourth power semiconductors devices in accordance with the direction in which load current is to be circulated through the load, said second NAND gate memory logic circuit means serving to memorize and maintain the supply of an enabling gating-on potential to the control gate of the last mentioned remaining one of the selected set of first and second or the selected set of third and fourth power semiconductor devices for maintaining the device conducting to thereby circulate load current through the load intermediate the pulsed conduction intervals at both power semiconductor devices in the selected set.

2. A pulse width modulated bridge power amplifier according to claim 1 wherein means are provided in each arm of the power bridge containing the first and second and third and fourth gate controlled power semiconductor devices for circulating load current in two directions in at least two adjacent arms of the power bridge, the said two adjacent arms of the power bridge being connected to opposite terminals of the load and having a common power supply terminal connection.

3. A pulse width modulated bridge power amplifier according to claim 2 wherein the load is inductive in nature and feedback power semiconductor diodes are connected in reverse polarity parallel circuit relationship across each of the gate controlled power semiconductor controlled conduction devices.

4. A pulse width modulated bridge power amplifier according to claim 3 wherein the gate controlled power semiconductor controlled conduction devices comprise power transistors

5. A pulse width modulated bridge power amplifier according to claim 2 further including delay means interposed in the output of the first NAND gate logic circuit means for delaying application of gating-on potentials to a selected one of the set of first and second or a selected one of the set of third and fourth power semiconductor devices for a predetermined period of time sufficient to assure turn-off of the power semiconductor device of the opposite set on the same side of the power bridge.

6. A pulse width modulated bridge power amplifier according to claim 5 wherein said first NAND gate logic circuit means comprises a first set of interconnected NAND gates each having one input terminal thereof connected to an output from the polarity determining input circuit means and having a second input terminal connected to the output of the other NAND gate, the respective outputs of the first set of interconnected NAND gates also being connected to selectively gate-on either a selected one of the set of first and second or a selected one of the third and fourth power semiconductor devices and lockout conduction of the other set to thereby assure conduction through the load in only one direction at a given point in time.

7. A pulse width modulated bridge power amplifier according to claim 6 wherein said second NAND gate memory logic circuit means comprises a second set of interconnected NAND gates each having one input terminal thereof connected to an output from a respective one of the first set of interconnected NAND gates and having a second input terminal connected to the output of the other NAND gate in the second set, the outputs of the second set of interconnected NAND gates also being connected to respective remaining ones of the set of first and second and the set of third and fourth power semiconductor devices for selectively gating on one of the remaining devices in each set in accordance with the direction in which load current is to be circulated through the load, the second set of interconnected NAND gates forming a bistable memory device which remains operative in the last state to which it has been triggered by an input signal supplied thereto and which maintains an enabling gating-on potential to the control gate of the aforesaid remaining one of the selected set of first and second or the selected set of third and fourth power semiconductor devices for maintaining the device conducting so as to circulate load current through the load intermediate the pulsed conduction intervals of both power semiconductor devices in the selected set, this aforesaid remaining power semiconductor device in the selected set being maintained enabled until a reversal of current through the load is called for and the bistable memory device is caused to change state.

8. A pulse width modulated bridge power amplifier according to claim 2 wherein the first and third power semiconductor control devices are connected in common to one power supply terminal and form an upper half of the power bridge and the second and fourth power semiconductor devices are connected in common to the remaining power supply terminal and form a lower half of the bridge with the first and fourth power semiconductor devices being connected in series circuit relationship across the power supply terminals and comprising a left side of the power bridge and the third and second power semiconductor devices are connected in series circuit relationship across the power supply terminals and comprise the remaining right side of the bridge, the load being connected intermediate the juncture of the first and fourth and the juncture of the third and second power semiconductor devices, said first NAND gate logic circuit means serving to enable conduction of either one of said first or third gate controlled power semiconductor devices and locking-out conduction of the other whereby conduction of only one of the power semiconduction devices on the upper half of the bridge is allowed and concurrent conduction of both semiconductor control devices on the upper half of the power bridge is positively prevented, and said second NAND gate memory logic circuit means serves to gate-on either one of said second or fourth gate controlled power semiconductor devices and maintains it on until current reversal through the load is called for and locks out the remaining one whereby conduction through either one of said second or fourth power semiconductor devices is provided dependent upon the direction of current to be supplied through the load and lockout of the other is provided thereby preventing concurrent conduction of two series connected power semiconductor devices in two adjacent arms of the power bridge on the same side of the load.

9. A pulse width modulated bridge power amplifier according to claim 8 further including delay means interposed in the output of the first NAND gate logic circuit means for delaying application of gating-on potentials to said first or third power semiconductor devices for a predetermined period of time sufficient to assure turn-off of either the fourth or second power semiconductor device on the same side of the power bridge.

10. A pulse width modulated bridge power amplifier according to claim 9 wherein said first NAND gate logic circuit means comprises a first set of interconnected NAND gates each having one input terminal thereof connected to an output from the polarity determining input circuit means and having a second input terminal connected to the output of the other NAND gate, the respective outputs of the first set of interconneced NAND gaes also being connected to selectively gate-on either the first or the third power semiconductor devices and lockout conduction of the other to thereby assure conduction through the load in only one direction at a given point in time.

11. A pulse width modulated bridge power amplifier according to claim 10 wherein said second NAND gate memory logic circuit means comprises a second set of interconnected NAND gates each having one input terminal thereof connected to an output from a respective one of the first set of interconnected NAND gates and having a second input terminal connected to the output of the other NAND gate in the second set, the outputs of the second set of interconnected NAND gates also being connected to respective ones of second and fourth power semiconductor devices for selectively gating on one of the remaining devices in each diagonal set in accordance with the direction in which load current is to be circulated through the load, the second set of interconnected NAND gates forming a bistable memory device which remains operative in the last state to which it has been triggered by an input signal supplied thereto and which maintains an enabling gating-on potential to the control gate of either the second or fourth power semiconductor devices for maintaining the device conducting so as to circulate load current through the load intermediate the pulsed conduction intervals of both power semiconductor devices in a selected diagonal set, the aforesaid second or fourth power semiconductor device in the selected diagonal set being maintained enabled until a reversal of current through the load is called for and the bistable memory device is caused to change state.

12. A pulse width modulated bridge power amplifier according to claim 11 wherein the load is inductive in nature and feedback power semiconductor diodes are connected in reverse polarity parallel circuit relationship across each of the gate controlled power semiconductor controlled conduction devices.

13. A pulse width modulated bridge power amplifier according to claim 12 wherein the gate controlled power semiconductor controlled conduction devices comprise power transistors.

14. A pulse width modulated bridge power amplifier according to claim 13 wherein the respective first and third power transistors are each driven by suitable driver transistors connected to the base electrodes thereof with the base electrodes of the driver transistors being connected through inverting circuit means to the respective outputs of the first set of interconnected NAND gates comprising the first NAND gate logic circuit means.

15. A pulse width modulated bridge power amplifier according to claim 14 wherein the delay means comprises a capacitor connected across the base-collector of each of said driver transistors for delaying turn-on of these transistors in response to a gating-on signal from the output of the first NAND gate logic circuit means.

References Cited

UNITED STATES PATENTS

| | | | |
|---|---|---|---|
| 3,260,912 | 7/1966 | Gregory | 318—341 |
| 3,308,307 | 3/1967 | Moritz | 318—18 |
| 3,309,592 | 3/1967 | Favre | 318—341X |
| 3,354,371 | 11/1967 | Ainsworth et al. | 318—341 |

BENJAMIN DOBECK, Primary Examiner

U.S. Cl. X.R.

318—681